United States Patent [19]
Arstein et al.

[11] Patent Number: 5,412,498
[45] Date of Patent: * May 2, 1995

[54] MULTI-RC TIME CONSTANT RECEIVER

[75] Inventors: David M. Arstein, Scotts Valley; William L. Geller, Foster City; Thomas E. Gles, Union; Mark S. Thomas, Sunnyvale, all of Calif.

[73] Assignee: Raynet Corporation, Menlo Park, Calif.

[ * ] Notice: The portion of the term of this patent subsequent to May 4, 2010 has been disclaimed.

[21] Appl. No.: 677,044

[22] Filed: Mar. 29, 1991

[51] Int. Cl.⁶ .............................................. H04J 14/08
[52] U.S. Cl. .................................. 359/189; 359/135; 370/51
[58] Field of Search ........ 359/189, 194, 196, 135–140; 370/60, 94.1, 51, 52; 375/94; 329/311

[56] References Cited

U.S. PATENT DOCUMENTS

| | | | |
|---|---|---|---|
| 3,714,581 | 1/1973 | Sage | 375/94 |
| 3,761,624 | 9/1973 | Lewis | 370/52 |
| 4,236,256 | 11/1980 | Brackett | 359/194 |
| 4,241,236 | 12/1980 | Nash | 359/149 |
| 4,241,455 | 12/1980 | Eibner | 359/194 |
| 4,679,252 | 7/1987 | Holland | 359/194 |
| 4,694,504 | 9/1987 | Porter | 359/194 |
| 4,908,530 | 3/1990 | Huang | 370/94.1 |
| 5,208,693 | 5/1993 | Arstein | 359/189 |

OTHER PUBLICATIONS

Steensma et al. "A 50 mb/s Fiber Optic Packetized Voice and Data Bus Using Random Multiple Access" ITT Defense Communication, Sep. 1990.

*Primary Examiner*—Leslie Pascal
*Attorney, Agent, or Firm*—Herbert G. Burkhard

[57] ABSTRACT

A protocol for fiber-optic communication systems, or other communication systems based on transmission of unipolar pulses having wide dynamic range provides for information to be transmitted in packets having a predictable time slot for each transmitter. The receiver for such protocol has a first relatively long RC time constant mode conditioned for reception of data packets whose time of arrival is well predictable and a second relatively short RC time constant mode conditioned for reception of asynchronous randomly received packets. In the relatively long RC time constant mode, each packet includes a preamble having a first clamp interval in which no pulse is transmitted, and a second clamp interval in which a continual pulse is transmitted. A transducer on the receiver translates the packets of pulses into differential electronic signals on first and second outputs. First and second coupling capacitors, receive respective outputs of the transducer and AC couples the signals to respective second terminals of the capacitors. First and second switches connect the second terminals of the respective coupling capacitors to ground during the first and second clamping intervals, respectively, of the preamble. By clamping the outputs of the transducer to ground during the first and second clamping intervals, a DC level for each incoming packet is instantly established independent of the magnitude of the incoming packet. In the asynchronous mode, relatively low impedance discharge paths are established to reduce the time constant of the receiver. An output circuit, connected to the second terminal of each of the first and second coupling capacitors, supplies sequences of digital output signals in response to the differential signals.

31 Claims, 6 Drawing Sheets

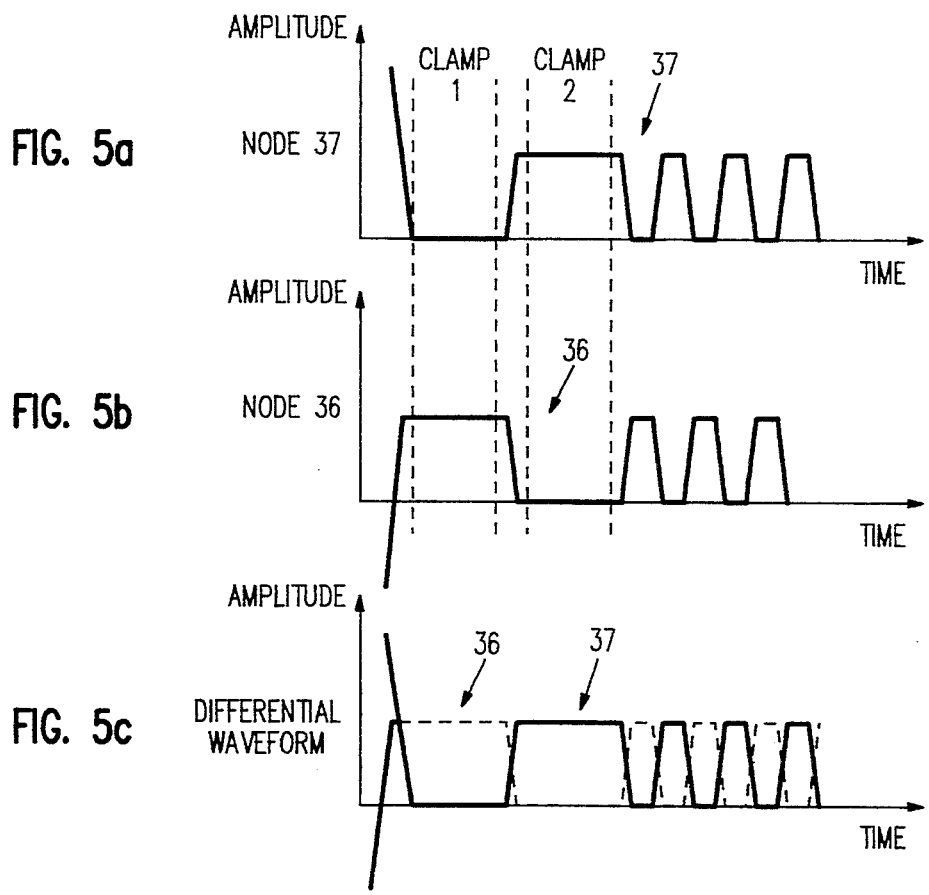
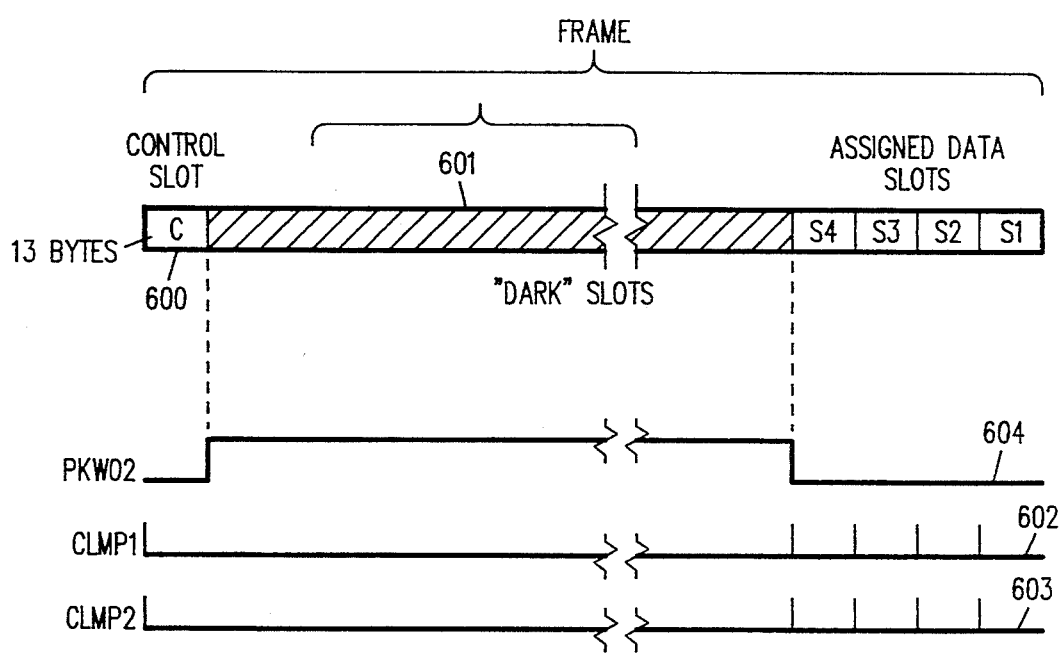
FIG. 6

MULTI-RC TIME CONSTANT RECEIVER

FIELD OF THE INVENTION

The present invention relates to communication networks, and particularly to signal protocols and receivers for communication networks preferably implemented with fiber-optic communication links.

BACKGROUND OF THE INVENTION

Networks based on optical fiber transmission systems provide a high bandwidth communications medium for relatively low cost. Uses of optical fiber communication systems are therefore expanding. For instance, proposals exist to implement integrated voice and data transmission systems using optical fibers throughout the public telephone network, so that each home has access to optical fiber (or "fiber-optic") transmission systems.

Fiber-optic transmission systems communicate data by means of optical bursts, or pulses of electromagnetic energy. The distance that these bursts propagate from remote stations to a head end attenuates the magnitude of the bursts as received at a head end receiver. These pulses are grouped into packets, one for each remote station transmitter, which together form a frame. Also, the packets come from any of a variety of sources in the system at any time. Thus, receivers must be adapted in these systems to handle not only variations in the magnitude of received signals and some unpredictable timing which causes tradeoffs in receiver design. It is preferred that the receiver be capable of handling a wide dynamic range of magnitude of the energy packets it receives, have high sensitivity, and require short packet preambles.

FIG. 1 illustrates one prior art receiver whereby an optical signal is detected by a photodiode and amplified by an amplifier 1 coupled to a capacitor 2 which is coupled to a comparator 3 having a second input coupled to a reference voltage $V_R$. The capacitor is also coupled to the reference voltage $V_R$ through resistor 4. According to this receiver, a short resistance-capacitance (RC) time constant is desired for the capacitor 2 and resistor 4 so as to minimize a length of time for the comparator 3 to establish an optimum charge, e.g. about one half of peak charge, so that a correct threshold for detection of the digital data in the packet can be established quickly. The optimum capacitor charge is obtained by using a packet preamble having consecutive ON-OFF pulses which represents transmission overhead. A short RC time constant is also desirable to achieve a large receiver dynamic range. However, an RC time constant which is too short can result in the capacitor becoming excessively charged when the packet data contains a successive string of binary ONs or becoming excessively discharged when the packet data contains a successive string of binary OFFs, each of which can result in bit errors being made by the comparator which minimizes the sensitivity of the receiver.

Steensma, et al., "A FIFTY MB/S FIBER OPTIC PACKETIZED VOICE AND DATA BUS USING RANDOM MULTIPLE ACCESS", published by ITT Defense Communications Division, Sep. 17, 1980 recognizes the need for a receiver having a large dynamic range. According to Steensma, et al., the incoming data is supplied to a detector having a first signal path, including a fifty nanosecond delay connected to one input of a comparator, and having a second signal path connected to a dynamic clamp which extracts the DC level or "pedestal" from the input signal to correct for changes in the magnitude of the received signal. The DC level is connected to the second input of the comparator to set the proper slicing level for digital signal regeneration. See pp. 33–38 and figures 13 of the Steensma, et al. publication.

The Steensma, et al. receiver works well for systems having very high signal levels. However, it is very inefficient at low signal levels. This arises because the peak detector used in its "dynamic clamp" is based on "hot-carrier diodes" or Shottky barrier diodes having a threshold of at least 200 millivolts each. Therefore, signals below the threshold of these diodes cannot be efficiently detected. Furthermore, the Steensma, et at. system has problems with temperature stability because of the diodes in the peak detector.

Accordingly, it is desirable to provide a protocol and a receiver for such protocol which is capable of supporting a wide dynamic range covering small signal levels (e.g. highly sensitive), which requires short packet preambles, which allows for data to have consecutive ON and OFF pulses, and which is suitable for use in large scale fiber optic communication systems. Also, it is desirable to provide a receiver and protocol capable of optimizing reception of data for asynchronous fiber-optic systems.

SUMMARY OF THE INVENTION WITH OBJECTS

The present invention provides a protocol for fiber-optic communication systems, or other communication systems, based on transmission of unipolar pulses, and a receiver adapted for the protocol. According to the protocol, information from a plurality of transmitters in an optical fiber network is transmitted in packets having a predictable time slot for each transmitter and whose magnitude has a wide dynamic range. Each packet includes a preamble having a first clamp interval training pulse in which no pulse is transmitted, and a second clamp interval training pulse in which a continuous pulse is transmitted. The receiver generates a clamp sequence in time with the preamble of each packet and translates the transmitted packets into sequences of digital signals whose baseline is independent of pulse amplitude over a wide dynamic range. The receiver is insensitive to any significant difference between a duration of the first and second clamp intervals.

According to one aspect of the present invention, a receiver, adapted for the protocol described above, is provided. The receiver includes a reference voltage, such as a ground terminal. A transducer translates the packets of pulses into differential electronic signals on first and second outputs. A first coupling capacitor receives a first output of the transducer at a first terminal, and AC couples the signals to a second terminal of the capacitor. A switch, connected to the second terminal of the first capacitor, connects the second terminal to ground during the first clamping intervals. A second coupling capacitor, having a first terminal connected to the second output of the transducer, AC couples signals from its first terminal to its second terminal. A second switch is connected to the second terminal of the second coupling capacitor, and connects the second terminal to ground during the second clamping intervals. An output circuit, connected to the second terminal of each of the first and second coupling capacitors, supplies sequences of digital output signals in response to the differential signals.

By clamping the outputs of the transducer to ground during the first and second clamping intervals, a DC level for each incoming packet is instantly established independent of the magnitude of the incoming packet. The differential signals on the second terminals of the capacitors are supplied to a detector which generates a digital output when the differential signals cross at the dynamically set DC level.

The receiver, according to the present invention, provides a very wide dynamic range, and is capable of detecting signals with very small magnitude.

The receiver, according to the present invention, preferably is utilized for detecting asynchronous time multiplexed packetized information, though it has utility in synchronous networks as well. For asynchronous transmission, the receiver is capable of operating over the entire range of operating conditions, from when the network is fully utilized with all time slots containing information to when only one time slot per frame is being utilized.

According to another aspect of the present invention, a multiple RC time constant mode receiver is provided for use in asynchronous networks. According to this aspect of the invention, the receiver is conditioned for operation in either a synchronous or asynchronous manner during the first mode and in an asynchronous manner in the second mode. Preferably the frames consist of a preset time slot for control packets, and a plurality of other time slots for data packets. When a remote terminal transmitter signs onto the network, the receiver detects its presence, and sends a time-of-flight correction parameter to the transmitter so that the transmitter can transmit a control packet during the control time slot of a frame. Then the receiver assigns a time slot within the frame to the transmitter for transmission of its data packets which are detected with the receiver operating in its first RC time constant mode. Time slots during the frame to which remote transmitters have not been assigned are operated in an asynchronous mode. In the asynchronous mode, the receiver is set to its second RC time constant mode whereby it is conditioned to receive information with a higher frequency response, or a shorter time constant, than in the first mode for detecting assigned data or control data in assigned time slots. Furthermore, for the control packet time slot, and for the assigned data packet time slots within the frame, the clamping algorithm described above is implemented.

According to another aspect of the invention, the invention includes a fiber-optic communications network, comprising at least one head end including a head end receiver; optical fiber link means; a plurality of remote stations connected to the head end by the optical fiber link means, each of the remote stations including transmitting means, coupled to at least one optical fiber communications link means, for transmitting on the optical fiber communications link means packets of pulses of light representing information; the head end including means for randomly assigning packetized slots to the transmitting means independent of a magnitude of the pulses in each packetized slot to be received by a head end receiver, the head end receiver including means for detecting the pulses when adjacent packetized slots have pulses whose energy varies by more than 20 dB and whose energy can be at least as low as −40 dBm with a bit error rate of better than $10^{-9}$ for packets having data being transmitted at a frequency in excess of 1 megabit per second.

According to another aspect of the invention, the invention includes a fiber-optic communication network, comprising a head end receiver; at least one optical fiber link; a plurality of stations for transmitting information across the optical fiber link to the receiver in a time multiplexed bus frame, each station including a transmitting means; at least one transmitting means transmitting data packets of pulses representing information, each packet including a preamble, a beginning of the preamble including a first clamping interval during which no pulse is transmitted and a second clamping interval during which a continuous pulse is transmitted; and the receiver being responsive to the first and second clamping intervals in transmitted packets and including clamping, AC coupling means, and comparator means, the clamping means clamping the AC coupling means during the clamping intervals so as to level a DC voltage between first and second inputs of the comparator means in a manner which is insensitive to any significant differences between a duration of the first and second clamping intervals so that the transmitted packets can be translated to sequences of digital signals by the comparator means.

Other aspects and advantages of the present invention can be seen upon review of the figures, the detailed description and the claims which follow.

BRIEF DESCRIPTION OF THE DRAWINGS

FIGS. 5(a) through 5(c) are graphs illustrating the DC level of nodes 36 and 37, and the resulting differential waveform at the input to a DC level crossing detector 43 from the block diagram of FIG. 3 during clamping intervals.

FIG. 6 is a timing diagram illustrating a frame, a mode control signal and the clamp signals according to a preferred embodiment of a present invention.

DETAILED DESCRIPTION OF PREFERRED EMBODIMENTS

A detailed description of preferred embodiments of the present invention is provided with reference to the figures.

Figure 1:
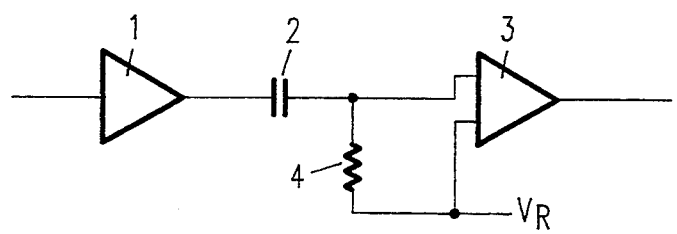
FIG. 1 is a block diagram of a prior art circuit.
Figure 2A:
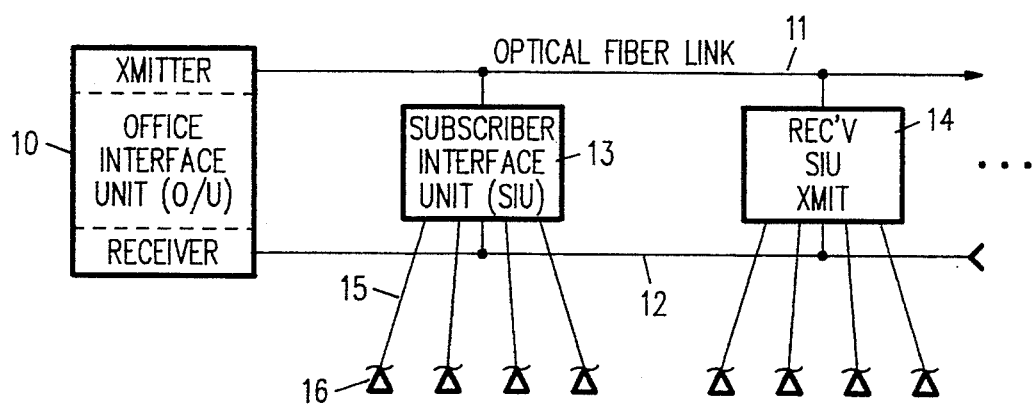
FIG. 2a is a block diagram of one type of optical fiber communications system in which the present invention may be applied.

FIG. 2a illustrates a basic optical fiber communication system, including a head end or an office interface unit (OIU) 10 which is connected by optical fiber links 11 and 12 to a plurality of remote stations or subscriber interface units (SIUs) 13, 14. Each SIU is coupled by means of a communication link, for instance link 15, to a plurality of homes, businesses, etc., which include telephones, for instance telephone 16, or other information processing devices, like computers, facsimile machines, televisions, etc.

The office interface unit includes a transmitter which transmits information along optical fiber link 11, and a receiver which receives information from each of the SIUs across optical fiber link 12. Similarly, each of the SIUs includes a receiver which is connected to optical fiber link 11, and a transmitter which is coupled to optical fiber link 12. Links 11, 12 alternatively could be replaced by a single link carrying bidirectional traffic.

Of course, networks based on optical fiber links can take a wide variety of other configurations, including a passive star network by which each SIU is connected by a separate optical fiber link to a main bus fiber which in turn is connected to the office interface unit electro-optic transducer or receiver.

Figure 2B:
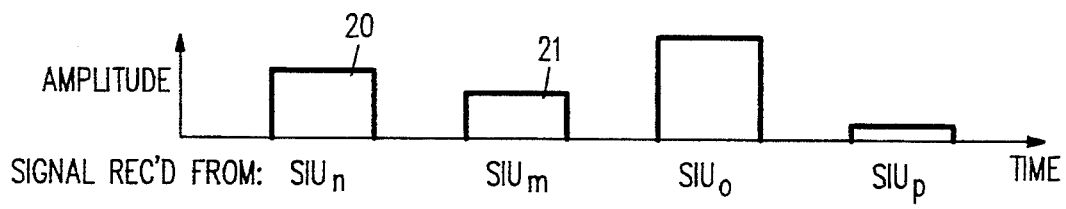
FIG. 2b is a graph illustrating the dynamic range of the packets of optical bursts communicated in communication systems according to the present invention.

In optical fiber communication systems, and other systems based on the transmission of information by unipolar energy pulses, the distance of propagation of the packets of information has an effect on the amplitude of the signal received. FIG. 2b is a graph which illustrates this phenomenon. The graph in FIG. 2b shows amplitude of the received burst versus time. Each SIU generates a packet of information which is transmitted across its link to the OIU receiver. The signals 20 received from $SIU_n$ will have a first amplitude based on the distance of propagation of the signal, and other factors. Similarly, the signals 21 received from $SIU_m$ will have a different amplitude and so on down the line. In optical fiber transmission systems, a dynamic range of the amplitude of the received packets of information can be quite wide. Therefore, the OIU receivers in the systems preferably must be able to preferably handle a dynamic range of ten to thirty dB in amplitude of the signal. Furthermore, they must be able to handle very low magnitude signals, for instance, less than 200 millivolts transducer output. In addition, if the packets are being received asynchronously, the receivers must also recover the proper phase for each packet.

According to a preferred embodiment of the invention, the unipolar energy pulses from each SIU are produced by lasers which are biased immediately below their threshold current value, as described in U.S. Ser. No. 07/504,167, filed Apr. 3, 1990, assigned to the assignee of the present invention, the disclosure of which is incorporated herein by reference.

Figure 3:
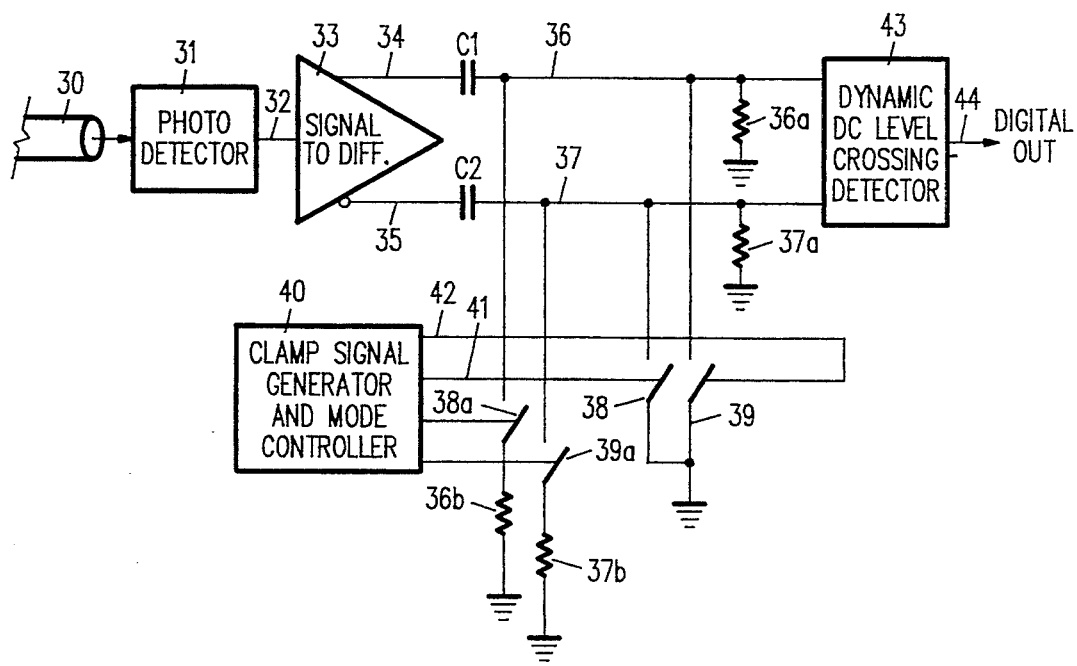
FIG. 3 is a block diagram of a receiver according to the present invention.

FIG. 3 is a block diagram of the receiver according to the present invention. Packets of bursts of light in each of the information packets from each remote terminal are received from optical fiber 30. A photodetector 31 transduces the bursts of light into a current on line 32. A single to differential signal generator 33 translates the current on line 32 to a differential signal on lines 34 and 35, e.g. data and data* respectively. Capacitor C1 has a first terminal connected to the line 34, and a second terminal connected to line 36. Similarly, capacitor C2 has a first terminal connected to line 35 and a second terminal connected to line 37. These capacitors provide AC coupling of the signals on lines 34 and 35 to the lines 36 and 37. A first switch 38 is connected from line 37 to ground and a second switch 39 is connected from line 36 to ground. A clamp signal generator and mode controller 40 predicts the interval during which each packet of information will be received and generates a clamp 1 signal on line 41 during a time when a first training pulse is received and a clamp 2 signal on line 42 when a second training pulse is received. When the clamp 1 signal on line 41 is asserted, switch 38 is closed. Similarly, when the clamp 2 signal on line 42 is asserted, switch 39 is closed.

The clamp signal generator 40 makes its predictions using any one of a variety of known methods, a preferred method being the use of a time-of-flight algorithm, as described below.

The clamp signals are timed so that clamp 1 is asserted, for any specific SIU, during an interval in which a packet from the specific SIU generates an "OFF" or "0" binary signal or no output pulse, e.g., during a "dark" period following a packet which just preceded the packet for the specific SIU. In actuality, according to a preferred embodiment where the SIU lasers are all biased immediately below their threshold value, the fiber is actually not truly totally "dark" during the period between packets since the SIU lasers are transmitting energy corresponding to that produced by a current which is immediately below their threshold value. This "dark" period represents time when "relatively" little light is being received and the fiber is relatively dark. Clamp 2 on line 42 is generated during an interval for the specific SIU during which a constant "ON" or binary "1" output pulse is generated by the specific SIU corresponding to a laser bias current above threshold. Accordingly the clamp signals are timed so that the clamp 1 signal is asserted when the signal on line 36 is in its OFF state, and the clamp 2 signal is asserted when the signal on line 37 is in its OFF state. Closure of the switches 38, 39 rapidly drains the capacitors C1, C2 to a common predetermined potential thereby equalizing a DC component of the voltage on lines 36, 37.

Referring to FIG. 3, a dynamic DC level crossing detector (e.g. comparator) 43 is connected to lines 36 and 37 and generates digital output signals on line 44 in response to the differential signals on lines 36 and 37. The digital output signals on line 44 are coupled to a clock recovery circuit (not shown) which generates a clock for recovery of digital signals from the input. Also, the signals on lines 44 are connected through a delay line as input to a latch (not shown), which is clocked by the clock generated in the clock recovery circuit. The output of the latch is recovered digital output signals from the received packet.

Figure 4:
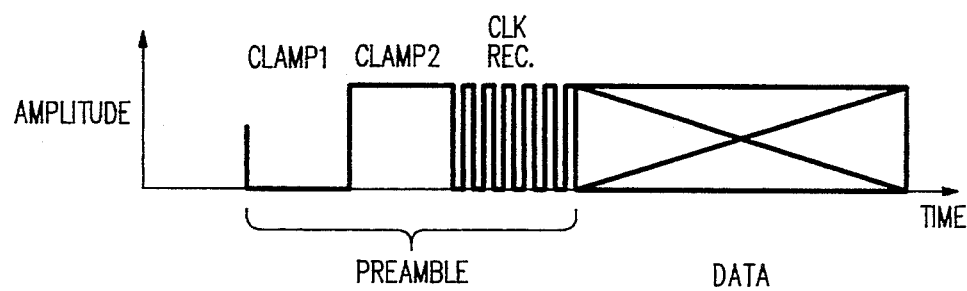
FIG. 4 is a graph illustrating a protocol according to the present invention.
Figure 8:
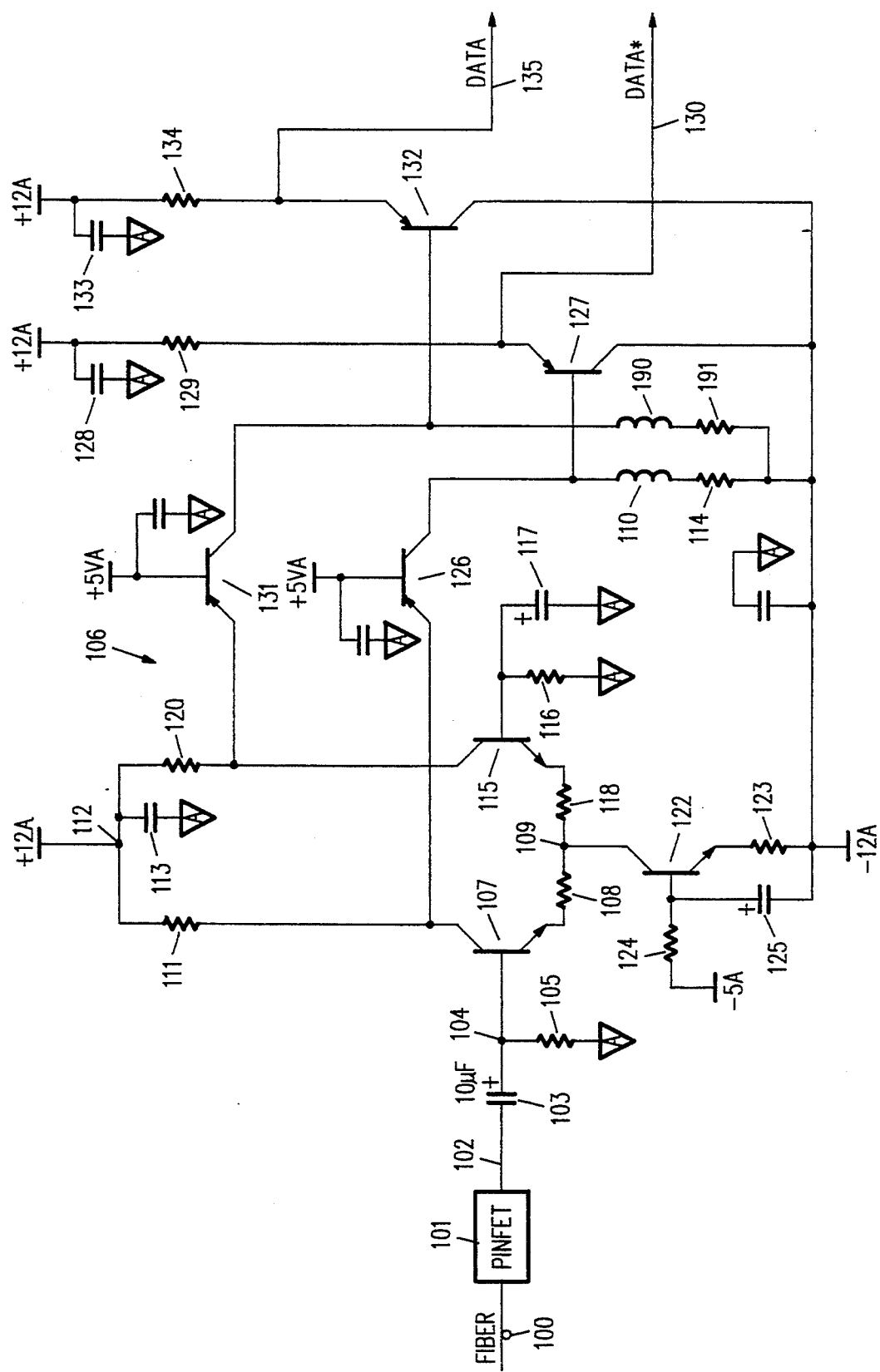
FIGS. 8 and 9 make up a schematic diagram of a preferred embodiment of a receiver according to the present invention.
Figure 9:
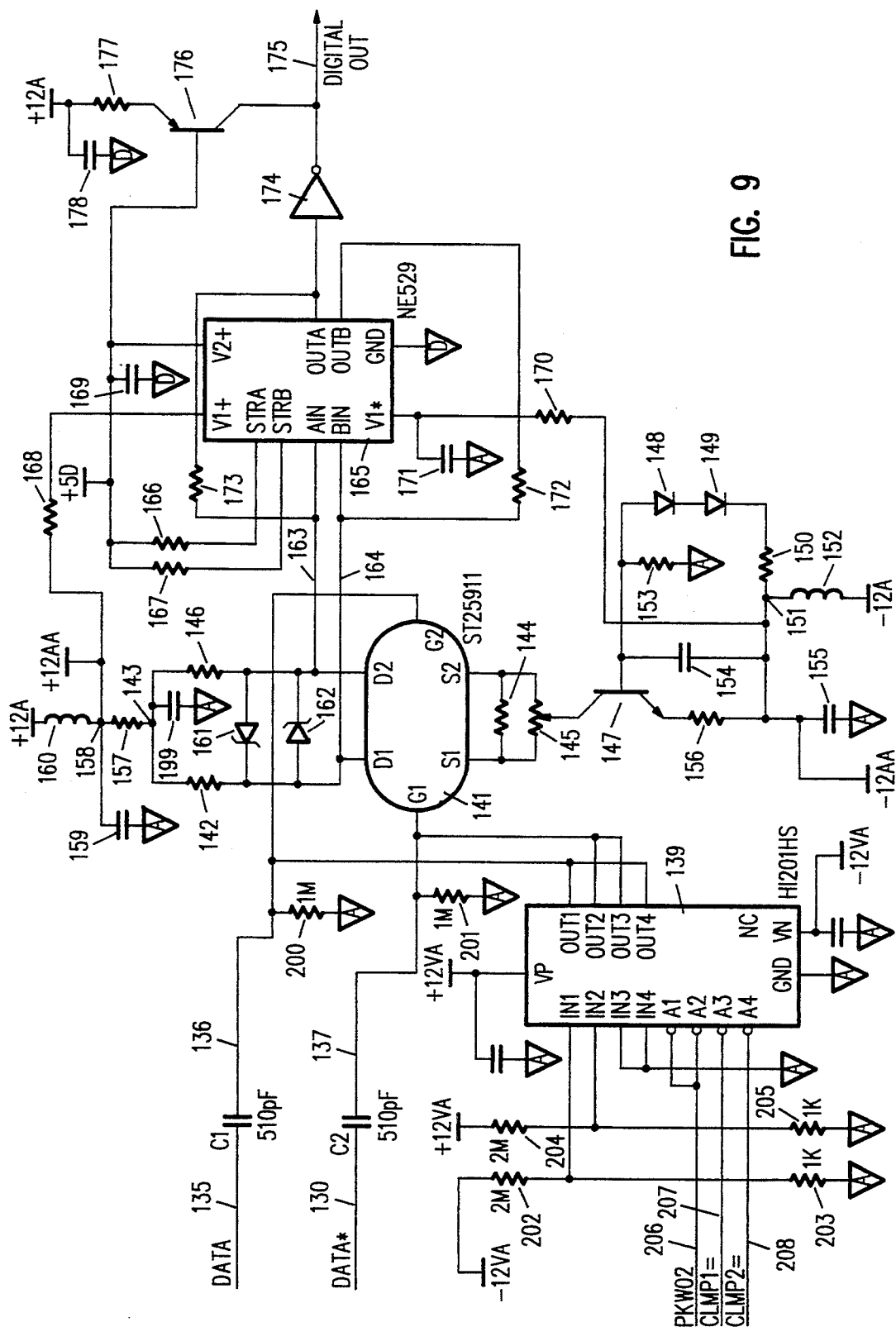

The receiver illustrated in FIG. 3 dynamically compensates for the amplitude of the input signals received on the fiber 30 since the DC component of the voltage on lines 36, 37 is rapidly equalized with the protocol illustrated in FIG. 4. The graph in FIG. 4 illustrates a packet of information from a specific SIU. The packet includes a preamble section and a data section as illustrated in FIG. 4. The preamble includes a clamp 1 training pulse interval, during which an OFF pulse is transmitted, and a clamp 2 training pulse interval during which an ON pulse is transmitted. After the clamp 1 and clamp 2 intervals, the clock recovery sequence is transmitted. According to a preferred embodiment, as illustrated in FIGS. 8 and 9, for a fiber-optic communication system transmitting at 20.48 megabits per second, clamp 1 and clamp 2 intervals of approximately 200–500 nanoseconds plus 1 or more bit periods is used. In a preferred system, the entire clamp interval is six bit periods or approximately 300 nanoseconds. The cushion of 1 or more bit periods is preferred in order to compensate for any phase misalignment between the preamble of the received signal. The length of the clamp interval should be adjusted to meet the specification of the receiver, and the data rate of the transmission system. It must be long enough to ensure successful clamping of lines 36 and 37 to a common DC voltage potential, and short enough to avoid waste of signal bandwidth. Optionally, the clamp 1 and clamp 2 intervals can each be longer than 1, 2, 3, 4, 5, 6, 7, or 8 bit periods, preferably each being shorter than 30, 25, 20, 15, 10, or 8 bit periods.

The circuit of FIG. 3 dynamically controls the DC level of the incoming signals at nodes 36 and 37 by forcing them to be at ground (or some arbitrary) potential during clamping intervals clamp 2 and clamp 1, respectively, as illustrated in FIG. 5(a) and (b). During the clamp 1 time interval, switch 38 is closed, and during the clamp 2 time interval, switch 39 is closed. Both of these switches are in the OFF (open) state at other times. As indicated above, the signals at nodes 36 and 37 are at ground potential (or some predetermined arbitrary DC voltage) during the respective clamping intervals. Capacitors C1 and C2 are charged appropriately to accommodate this signal condition. At the end of the clamp intervals, the switches are opened and the capacitors maintain their respective charges until the next packet when the clamping process is repeated. The charge is maintained on the capacitors C1, C2 by utilizing resistors 36a, 37a which have a relatively high resistance. During the clamping and data detection times, the receiver operates in its first mode whereby additional switches 38a, 39a, connected to ground (or some arbitrary) potential through relatively low resistance resistors 36b, 37b, are maintained open. The capacitor charges are maintained because of the high OFF impedance of the switches 38, 39 and high input impedance of the DC level crossing detector 43 establish a relatively long time constant for discharging the capacitors C1 and C2. The resulting differential waveform thus presented to the DC level crossing detector is illustrated in the left portion of FIG. 5(c). Accordingly, the receiver can detect packets when only one SIU is transmitting (e.g. each frame contains only one active packet and otherwise is dark) as well as when all SIU's are transmitting (e.g. each frame is fully loaded with active packets).

At the end of the clamping intervals, the signals supplied at the output of the single to differential signal generator 33 are AC coupled to the dynamic DC level crossing detector 43. Because each of lines 36 and 37 are charged to essentially the same DC level, the slicing point for digital signal recovery is instantly established halfway between the peak to peak swing of the signals.

It is found that this clamping technique and protocol is capable of handling signals of very small magnitude. For instance, in fiber-optic systems, the receiver has been demonstrated over a range of optical power for each packet burst from −48 dBm (0 dBm equals 1 milliwatt) to −24 dBm with better than a $10^{-9}$ bit error rate at a data transmission speed of 20.48 megabits per second with a data encoding protocol which allows no more than four consecutive ON or OFF data pulses. This translates to signals in the range of 20 millivolts at the output of the photodetector on line 32 to more than 2 volts on line 32, or over a 20 dB dynamic range, without gain control. Furthermore, the dynamic DC level recovery is automatic, eliminating the need for pedestal generators and the like which have been required in prior art systems. A preferred embodiment is for use with packets having a minimum optical power less than −45, −40, −30 dBm, or −20 dBm, and having maximum optical power greater than −30, −25, −15, −5, or 0 dBm, with a data transmission speed in excess of any one of 1, 2, 5, 10, or 20 megabits per second, with a data encoding protocol that allows no more than four consecutive ON or OFF pulses, and which results in a bit error rate less than $10^{-9}$.

In a logical bus fiber-optic network, the clamp signals are timed by controlling the SIUs so that their packets arrive at the OIU receiver in an orderly predictable manner. In a preferred system, this is accomplished by a master OIU controlling the slave SIUs, preferably in a quasi-synchronous manner. This is accomplished by establishing a frame, as illustrated in FIG. 6, for transmission of control packets and data packets to and/or from the SIUs. A frame includes a first control slot 600 during which a control packet can be transmitted to and/or from any one SIU on the network. The SIUs in a preferred system respond only to polling from the OIU 10 and respond to polls using the control packet, so that there is no collision in the control slot. Known or active SIUs are assigned data slots for data packets within the frame. Thus, a first SIU is assigned slot S1 at the end of the frame, a second SIU is assigned slot S2, and so on. The frame is filled with SIUs data packets which have been detected by the OIU from the back of the frame forward. An amplitude of the data packets are preferably ordered randomly. This leaves a "dark" interval 601 in the frame during which unassigned SIUs can transmit and be detected by the OIU, and then assigned a time slot from the back portion of the dark interval 601. Thus, preferably the receiver operates in two RC time constant modes. In the first mode, the receiver is conditioned with a relatively high or long time constant and clamped as described for fast and sensitive data acquisition. As illustrated at lines 602 and 603 of FIG. 6, the CLMP1 and CLMP2 signals are asserted at the beginning of each assigned data slot according to the principles described above. In the second mode, the receiver is conditioned with a relatively short time constant useful for detecting heretofore inactive or unassigned SIUs which randomly transmit in the dark slot 601.

The second short time constant mode is established by the mode controller 40 closing the switches 38a, 39a throughout the dark interval 601 so that low resistance resistors 36b, 37b are connected to lines 36, 37. During data acquisition, the switches 38a, 39a are maintained open.

The control circuitry in the receiver which performs frame time slot management generates a control signal PKWD2 which is used to change the mode of the receiver. As can be seen, in the transition from the control slot 600 to the dark slot 601, and in the transition from the dark slot 601 to the assigned data slots, the PKWD2 signal is toggled. When the PKWD2 signal, as shown at trace 604 of FIG. 6, is high, the receiver operates in its second mode adapted for asynchronous communication. In this second mode, the receiver is conditioned by establishing a fixed short time constant differentiating mode for fast response. According to preferred embodiments, the RC time constants differ by more than any one of 2 dB, 3 dB, 5dB, 8dB, 10 dB, 14 dB, 17 dB, 20 dB, 25 dB, 30 dB, or 40 dB.

The OIU preferably executes an algorithm for first determining the frame timing and each SIU's time-of-flight position in the network, and second for determining an optimum power necessary for transmission by each SIU to accomplish efficient communication to the receiver at the OIU. In a preferred system, the OIU polls the SIUs with a command request. An SIU on the network which does not have an assigned time slot can either be detected by an operator instructing the OIU to poll the newly connected SIU, or by a random polling sequence operated by the OIU independent of a human operator whereby the OIU periodically polls each inactive SIU, the latter being a preferred embodiment.

In the second mode, the OIU receiver operates in a manner such that the timing of signals from all of the SIUs in the network should appear equal so that the signal the OIU receiver detects is either synchronous or very close to synchronous, e.g. asynchronous to a controllable tolerance. Thus, any events happening in all SIUs in the network at a given time and immediately reported will arrive at the OIU during a one time frame period.

All SIU frame timing is preferably derived from the fiber link 11 which receives information from the OIU, called the READ BUS. The READ BUS 11 is routed such that the near end SIUs receive data from the OIU first, and the far end SIUs receive data from the OIU last. The maximum length of fiber-optic cable in a preferred system is 10 kilometers. Since light propagates down an optical fiber at a velocity of approximately 0.2 meters per nanosecond, it is possible for the frame timing of the near end SIU to precede that of the far end by a total of 50 microseconds. From the perspective of the OIU receiver, this timing difference is compounded by a propagation delay of the return bus 12, called the WRITE BUS. Therefore, the 50 nanosecond SIU frame skew appears to be a 100 microsecond skew at the OIU receiver for a round trip. To make all the SIUs appear to the OIU as having the same timing, each SIU preferably has a time-of-flight register to offset the timing it receives from the READ BUS. The time-of-flight register in each SIU adds an additional delay such that the round trip delay from the OIU through any SIU and back to the OIU is one frame. For a preferred frame rate of 8 KHz, the total delay is 125 microseconds. Therefore, an SIU at zero kilometers from the OIU would be assigned a delay of approximately 125 microseconds, neglecting electronic gating delays. Similarly, an SIU four kilometers from the OIU would be assigned a delay of about 85 microseconds, i.e., 125 minus 40 microseconds, and so on.

Since there is no a priori way of the OIU knowing what the round trip delay will be for a given heretofore inactive SIU connected to the network, it is necessary to determine the round trip delay by the OIU commanding the given SIU to attempt to place a control packet on the WRITE BUS 12. The OIU command is made in the control slot on the READ BUS. The response from the SIU is then hopefully detected in the dark slot 601 where the OIU receiver is operating in its second mode for efficient asynchronous data detection. In order for the give OIU to place the control packet in the dark slot 601 of the WRITE BUS so it can be detected initially, it may be necessary for the OIU to make the given SIU make several attempts, referred to as sign-on attempts. Sign-on attempts are preferably initially done at the lowest SIU transmit power. Basically, on the first attempt, any arbitrary time-of-flight can be chosen, e.g. a time-of-flight of zero (0) microseconds. If the control packet is not detected, then a second attempt is made after incrementing the time-of-flight a predetermined amount. If the control packet continues to be undetected, then the time-of-flight is incremented until a full frame time has been scanned. Preferably each SIU sign-on attempt is commanded by the OIU. For a frame ram of 8 KHz, numerous SIU attempts can be requested over a relatively short period of time by the OIU and all sign-on permutations for all inactive SIUs can be covered every few minutes, e.g. less than 10 minutes.

The size of the time-of-flight increments must be chosen such that they are small enough not to jump over the available dark slot 601, but not so small such that the number of increments to scan a frame is excessively large. This process continues until the control packet is detected or an entire frame is scanned. If it is not detected over an entire frame time, then the process is repeated at a higher SIU optical transmit power. If the control packet is not detected after scanning a full frame at all power levels, then the process may be either repeated to verify the SIU is truly inactive. Also, the entire algorithm of polling all inactive SIUs preferably is periodically repeated over time so any SIU ready to be activated can be activated. Under normal conditions, any workable SIU which heretofore has been inactive but is now configured to become activated will be detected and its time-of-flight determined in short order, e.g. within a few minutes assuming a worst case scenario where the OIU is polling numerous inactive SIUs and also provisioning working SIUs and performing other tasks using its control slot. Then, using a subsequent control slot, the OIU assigns a time slot within the frame to the signed-on SIU and the signed-on SIU adjusts its time-of-flight accordingly. Thereafter, the clamping mode, e.g. mode 1, of the receiver is used for reception of data packets from the signed-on SIU.

Figure 7:
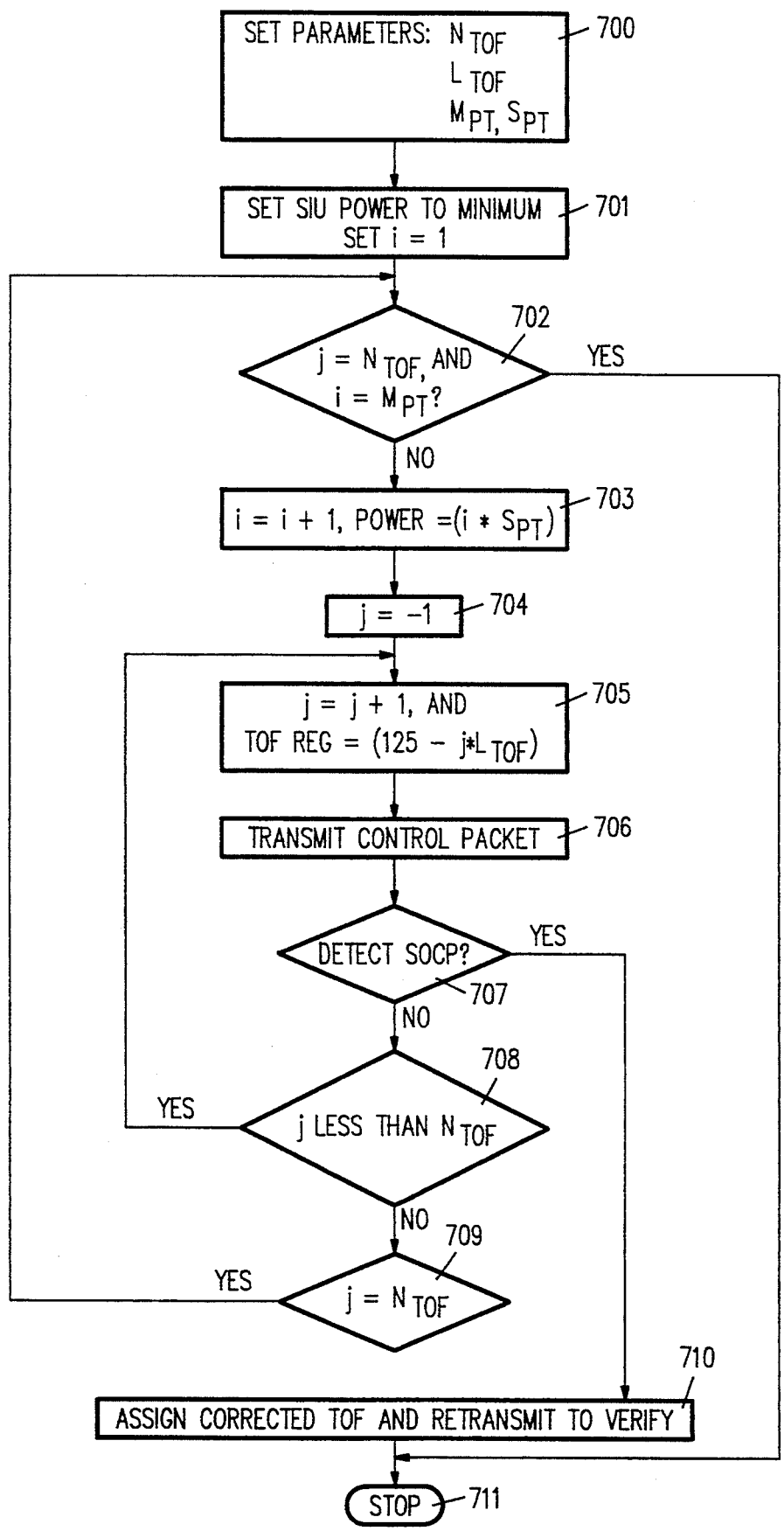
FIG. 7 is a flow chart illustrating a method for generating time-of-flight parameters for a network according to the present invention.

A preferred time-of-flight algorithm is illustrated in FIG. 7 for an 8 KHz frame rate. In the first step, the parameters are set for the sign-on algorithm, including: $N_{TOF}$ which is equal to the maximum number of time-of-flight increments; $L_{TOF}$ which is equal to the magnitude of the time-of-flight increments; $M_{PT}$ which is equal to the maximum number of power increments for the SIU; and $S_{PT}$ which is equal to the magnitude of the power control increments (block 700).

Initially preferably a polled SIU has its power set to the minimum value and the index "i" is set equal to 1 (block 701). Next, a decision block for the index i and the index j is entered at block 702. If j is equal to the number of time-of-flight intervals $N_{TOF}$ and i is equal to the number of power control intervals $M_{PT}$, then the algorithm has been completed without a sign-on. Generally this indicates the SIU being polled is still inactive, e.g. is not being used by the network. This could occur where SIU are positioned on a network where telecommunication services are yet to be connected or to commence. If the maximum of the index i has not been reached, then the index i is incremented and the power is set to i times $S_{PT}$ (block 703). Next, the index j is set to −1 (block 704). Next, the time-of-flight incrementing loop is entered, is set to j+1, and the time-of-flight register is set to 125 −j times the time-of-flight increment $L_{TOF}$ (block 705). Next, the SIU transmits a control packet (block 706) (assuming it is active and capable of trying to attempt to sign-on). The algorithm then tests in the next frame whether its "start of control packet" was detected by the OIU saying so in a subsequent control slot. If the control packet was detected, then the OIU will compose a corrected time-of-flight value so that the SIU may align with the control slot in the frame, and instructs the SIU to re-transmit the control packet to verify the correct timing (block 710). If, in block 707, no start of control packet was detected, then the index j is tested to determine whether it is less than the maximum number of time-of-flight intervals $N_{TOF}$. If it is less, then the loop continues at block 705. If it is not less than the maximum number, then it must be equal to the maximum number of intervals (block 709). In this case the algorithm begins again at block 702 and increments the power of transmission. The loop continues until a successful transmission is achieved or the algorithm is completed.

As will be understood, the clamping mode of the receiver cannot be used during the dark period or dark slot of the frame if one is to detect rather random asynchronous sign-ons of SIUs to become activated on the system and yet utilize relatively short packet preambles. Thus, a dual mode receiver has been implemented. A preferred electrical circuit of the dual mode receiver is described in detail with reference to FIGS. 8 and 9. This receiver operates in the second mode which has a fixed short RC time constant suitable for receiving the asynchronous sign-ons during the dark slot 601 of the frame. It also includes the first mode which has a longer RC time constant and clamping algorithm suitable for data detection over a wide dynamic range with high sensitivity, short preambles, at high data rates, and with low error rates. The receiver could also be conditioned in multiple modes for a variety of other characteristics of the signals. For instance, automatic gain control could be used in a selected mode to extend the dynamic range over even greater variations in signal amplitude. Alternatively, an automatic gain control circuit could be adapted to meet different characteristics during different modes. The multiple mode receiver allows a truly asynchronous network to be managed in a synchronous manner to improve the data transmission facility of the network, without requiring a rigorously synchronized network.

Accordingly, it can be appreciated that the OIU can sign-on any SIU on the fly. The OIU sends out a sign-on inquiry, the OIU receiver is switched from clamp mode to sign-on mode, and a possible SIU acknowledgement received, whereupon the OIU receiver switches back to clamp mode at a time not later than data is expected from assigned data and control slots. By precisely knowing the time delay between each active SIU and the OIU, the OIU can accurately predict when any packet from any active SIU is to be received and when clamps 1 and 2 are to be activated for training pulses for any SIU assigned data slot information.

FIGS. 8 and 9 provide a circuit diagram of a preferred embodiment of the dual mode receiver according to the present invention. FIG. 8 illustrates the photodetector and the single to differential signal generator portion of the circuit (reference numerals 30–35 in FIG. 3), while FIG. 9 illustrates the AC coupling, the clamp switches and the output detector sections (reference numerals 36–44 in FIG. 3).

In FIG. 8, the fiber 100 is coupled to a PINFET 101 such as the RTZ-017-012 PINFET manufactured by PCO, located in Chatsworth, Calif. The PINFET 101 is connected in a standard manner and supplies an output current on line 102. A large capacitor 103 is connected from line 102 to node 104. Resistor 105 is connected from node 104 to ground. This capacitor 103 and resistor 105 provide a high pass filter to the input of the differential switch 106. The differential switch 106 includes bipolar transistor 107 having its gate connected to node 104, its emitter connected through resistor 108 to node 109, and its collector connected through resistor 111 to node 112. Capacitor 113 is connected from node 112 to the analog ground. Node 112 is connected to a +12 V analog supply. The differential switch includes a second bipolar transistor 115 having its gate connected through resistor 116 and capacitor 117 in parallel to the analog ground. The emitter of transistor 115 is connected through resistor 118 to node 109. The collector of transistor 115 is connected through resistor 120 to node 112. Node 109 is connected to a current source composed of transistor 122 having its collector connected to node 109 and its emitter connected through resistor 123 to a −12 V analog supply. A resistor 124 is connected from the gate of transistor 122 to a −5 V analog supply. Also, capacitor 125 is connected from the gate of transistor 122 to the −12 V analog supply.

The collector of transistor 107 is connected to the emitter of transistor 126. The gate of transistor 126 is connected to a +5 V analog supply. The collector of transistor 126 is connected to the gate of transistor 127. The collector of transistor 127 is also connected across inductor 110 and resistor 114 to the −12 V supply.

The collector of transistor 127 is connected to the −12 V analog supply. The emitter of transistor 127 is connected through resistor 129 to the +12 V analog supply and across capacitor 128 to analog ground. The emitter of transistor 127 supplies an output on line 130 labelled DATA* which supplies an inverted version of the signal at node 104.

Similarly, the collector of transistor 115 is connected through the emitter and collector junctions of transistor 131 to the gate of transistor 132. The gate of transistor 131 is connected to a +5 V analog supply. The collector of transistor 131 is also connected across inductor 190 and resistor 191 to the −12 V supply.

The collector of transistor 132 is connected to the −12 V analog supply. The emitter of transistor 132 is connected through resistor 134 to the +12 V analog supply and through capacitor 133 to analog ground. The emitter of transistor 132 is also connected to the line 135 which supplies the signal DATA, which is a true version of the signal at node 104.

Therefore, an input burst on the fiber 100 is translated by the circuit of FIG. 8 to a differential voltage on lines 135 and 130.

On FIG. 9, the lines 135 and 130 from the output of the single to differential signal generator of FIG. 8 are connected through capacitors C1 and C2 respectively to nodes 136 and 137 respectively. Capacitors C1 and C2 of FIGS. 9 correspond to the capacitors C1 and C2 of FIG. 3.

Nodes 136 and 137 are connected across high value resistors 200 and 201, respectively to analog ground. Also, nodes 136 and 137 are connected to the terminals OUT1 and OUT4, and OUT2 and OUT3, respectively, of the integrated circuit 139 which provides a plurality of FET switches. One example of such integrated circuit is the HI201HS manufactured by Harris Semiconductor. The switches are controlled by the inputs A1 through A4. The inputs to the switches include the inputs IN1 through IN4 on the integrated circuit.

The input IN1 is connected across a two megaOhm resistor 202 to the −12 V analog supply, and across a one kiloOhm resistor 203 to the analog ground. The input IN2 is connected across a two megaOhm resistor 204 to a +12 V analog supply and across a one kiloOhm resistor 205 to analog ground. The inputs IN3 and IN4 are connected directly to analog ground.

The control terminals A1 and A2 are connected to the signal PKWD2 on line 206. The inputs A3 and A4 are controlled by the CLMP1* and CLMP2* signals on lines 207 and 208 which are active low versions of the clamp 1 and clamp 2 signals described with reference to FIG. 3.

This switching circuit provides a receiver which has two modes of operation. In the second mode, the PKWD2 signal on line 206 is asserted, and the time constant of the receiver is controlled by the capacitors C1 and C2 together with the voltage dividers composed of resistors 202 and 203, or 204 and 205, respectively. This provides a relatively short time constant receiver which can be used for signal acquisition when the timing of incoming packets cannot be predicted, e.g. true asynchronous detection.

In the first mode, the PKWD2 signal is not asserted, and the CLMP1* and CLMP2* signals perform the clamping routine described above. During the clamping mode, the time constant while sampling data is determined by the one megaOhm resistors 200 and 201 connected to nodes 136 and 137. The dynamic clamping allows a relatively higher or longer time constant mode to be utilized so that higher quality reception is achieved.

In the second mode, the PKWD2 signal is asserted, the clamps are inactivated, and the integrated circuit 139 connects nodes 136, 137 to analog ground through low resistance resistors 203,205 respectively. The relatively low resistance of the resistors 203,205 provides a relatively short time constant so that an optimum charge on the capacitors C1, C2 can be created quickly so that any packets received during the dark slot 601 when the second mode is utilized can be reliably detected, and its time-of-flight established accurately.

Nodes 136 and 137 are connected as inputs to differential amplifier composed of JFETs in integrated circuit 141. The integrated circuit 141 is the commercially available STZS911, manufactured by Siliconix, which includes two JFETs. The first JFET in the integrated circuit 141 has its gate G1 connected to node 137, its drain D1 connected through resistor 142 to node 143, and its source S1 connected through resistor 144 to the source S2 of the second JFET, and in parallel through the tapped resistor 145 to the source S2 of the second JFET. Similarly, the second JFET in the integrated circuit 141 has its gate G2 connected to node 136, its arain D2 connected through resistor 146 to node 143, and its source S2 connected to resistors 144 and 145.

The tap on resistor 145 is connected to the collector of current source transistor 147 which has its gate connected through diode 148, diode 149, and resistor 150 to the node 151. Node 151 is connected through inductor 152 to the −12 V analog supply. Also, the node 151 is connected to the −12 V analog "AA" supply.

The gate of transistor 147 is connected through resistor 153 to the analog ground, and through capacitor 154 to node 151. A capacitor 155 is connected from node 151 to the analog ground. The emitter of transistor 147 is connected through resistor 156 to node 151.

At the top of the Flit differential amp, node 143 is connected through resistor 157 to node 158. Node 143 is also coupled through capacitor 199 to analog ground. Node 158 is connected by means of capacitor 159 to the analog ground, and through inductor 160 to the +12 V analog supply. Also, node 158 is connected to the +12 V AA supply.

Shottky diode 161 is coupled from the drain D2 of the second JFET to the drain D1 of the first JFET; and Shottky diode 162 is connected the opposite way from the drain D1 of the first JFET to the drain D2 of the second JFET.

Therefore, the signals on lines 136 and 137 are connected to a differential amplifier formed by the JFETs in integrated circuit 141. These JFETs produce signals on the drains D1 and D2 which switch at midway between the amplitude of the two signals.

The signals on lines 163 and 164 are differential signals generated in response to the differential signals on lines 136 and 137. These signals are supplied as inputs AIN and BIN to comparator integrated circuit 165, implemented using, for instance, an NE529 manufactured by Signetics. This circuit is connected in the standard way, having the STRA and STRB inputs connected through resistors 166 and 167 to a +5V digital supply, the V1+ input connected through resistor 168 to the node 158, the input signal V2+ connected to the +5 V digital supply and through capacitor 169 to the digital ground. Also, the input V1* is connected through resistor 170 to the node 151 at the −12 AA analog supply. The GND input is connected to the digital ground. A capacitor 171 is connected from the VI* terminal to the analog ground.

The output OUTB of the integrated circuit is connected through resistor 172 to input line 164, and the output OUTA is connected through resistor 173, which matches resistor 172, to the input line 163. This provides hysteresis in the comparator. The output terminal OUTA is coupled through inverting buffer 174 to provide the digital output signal on line 175.

A pull-up current source transistor 176 has its collector connected to line 175, its-base connected to the +5V digital supply, and its emitter connected through resistor 177 to the +12 V analog supply. Also, a capacitor 178 is connected from the +12 V analog supply to the digital ground.

As can be seen, in FIG. 9, the differential signals on lines 135 and 130 are AC coupled to lines 136 and 137, and supplied as input to the high impedance differential amplifier composed of the JFET transistors on integrated circuit 141. The differential output of the JFETs in integrated circuit 141 are supplied on lines 163 and 164 to a comparator 165, which slices the input signal for digital output generation.

As can be seen, a receiver and a protocol for optical fiber communication systems has been provided which dynamically adapts to the magnitude of the incoming energy burst transmitted on the fiber over a wide dynamic range with high sensitivity at high data rates with minimum bit errors using relatively short data preambles. Furthermore, the receiver is capable of accurately detecting and translating very small signals transmitted in the fiber-optic communication system.

The system is particularly adapted to time slot multiplexed optical fiber communication systems in which the clamping signals CLMP1 and CLMP2 on the receiver can be generated using time-of-flight prediction algorithms, and the like, so that they coincide within a bit period or so of the clamping intervals in the preamble of each packet.

Further, a dual mode receiver has been provided which is suited for asynchronous networks, allowing operation in a "quasi-synchronous" mode to improve data acquisition in the network without requiring a rigorously synchronized network.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical applications.

What is claimed is:

1. A multi-RC time constant receiver for receiving an input signal, comprising:
   means for AC coupling the input signal to a detector, the AC coupling means comprising means for generating one of a plurality of available resistance-capacitance (RC) time constant states in dynamic response to the input signal.

2. The receiver of claim 1, the plurality of available RC time constant states including at least first and second RC time constant states, the first RC time constant state being at least 10 dB longer than the second RC time constant state.

3. The receiver of claim 1, the plurality of RC available time constant states including at least first and second RC time constant states, the first RC time constant state being at least 20 dB longer than the second RC time constant state.

4. The receiver of claim 1, the detector comprising a dynamic comparator, the receiver further comprising a single-to-differential generator which generates first and second differential output signals at first and second outputs, respectively, in response to the input signal, the first output signal being an inverse of the second output signal, the AC coupling means coupling the first and second outputs to the dynamic comparator.

5. The receiver of claim 4, the signal representing packetized information, the packetized information being encoded optically and received in frames, each frame comprising a slot which is predominantly dark adjacent a plurality of packetized information slots, further comprising:
   means for predicting the beginning of the predominantly dark slot and the packetized information slots of each frame;
   means for generating a first RC time constant state for detection of information in the packetized information slots; and
   means for generating a second RC time constant state for detection of information in the predominantly dark slot.

6. The receiver of claim 5, the packetized information slots containing information from a plurality of sources.

7. The receiver of claim 5, the dynamic comparator comprising a dynamic DC level crossing detector; the AC coupling means further comprising:
   clamping means for clamping a DC voltage on the first output when the input signal represents a binary OFF training pulse, and for clamping a DC voltage from a DC voltage reference source on the second output when the input signal represents a binary ON training pulse,
   the OFF and ON training pulses forming part of a preamble contained in the packetized information slots.

8. The receiver of claim 7, the clamping means comprising:
   first coupling means having a first terminal connected to the first output and having a second terminal, for AC coupling signals on the first terminal to the second terminal of the first coupling means;
   first switching means, connected to the second terminal of the first coupling means, for connecting the second terminal to the DC voltage reference source during the OFF training pulse;
   second coupling means having a first terminal connected to the second output and having a second terminal, for AC coupling signals on the first terminal to the second terminal of the second coupling means; and
   second switching means, connected to the second terminal of the second coupling means, for connecting the second terminal to the DC voltage reference source during the ON training pulse.

9. The receiver of claim 8, the AC coupling means further comprising third and fourth switching means for connecting a low impedance to the second terminals of the first and second coupling means, respectively, when establishing the second time constant state.

10. The receiver of claim 1, the input signal comprising packetized information, the AC coupling means allowing the detector to detect information in adjacent packetized slots which can be received at levels lower than $-45$ dBm and higher than $-25$ dBm, the detector having a bit error rate better than $10^{-9}$ for packets having data being transmitted at a frequency in excess of 20 megabits per second, the data being capable of comprising at least four consecutive OFF pulses and at least four consecutive ON pulses.

11. A fiber-optic network, comprising:
   a head end;
   optical fiber link means; and
   a plurality of remote stations connected to the head end by the optical fiber link means, each of the remote stations including transmitting means coupled to the optical fiber link means for transmitting thereon information represented by packets of pulses of light;
   the head end including receiving means for receiving an input signal comprising packetized light pulses from one or more of the remote stations, the receiving means comprising:
      means for generating an electrical signal in response to the input signal; and
      means for AC coupling the electrical signal to a detector, the AC coupling means comprising means for generating one of a plurality of resistance-capacitance (RC) time constant states in dynamic response to the input signal.

12. The network of claim 11, the plurality of RC available time constant states including at least first and second RC time constant states, the first RC time constant state being at least 10 dB longer than the RC second time constant state.

13. The network of claim 11, the plurality of RC available time constant states including at least first and second RC time constant states, the first RE time constant state being at least 20 dB longer than the second RC time constant state.

14. The network of claim 11, the detector comprising a dynamic comparator; the means for generating an electrical signal comprising a single-to-differential generator which generates first and second differential output signals at first and second outputs, respectively, in response to the input signal, the first output signal being an inverse of the second output signal, the AC coupling means coupling the first and second outputs to the dynamic comparator.

15. The network of claim 14, the information being transmitted and received in frames, each frame comprising a slot which is predominantly dark adjacent a plurality of packetized information slots, the receiving means further comprising:
  means for predicting the beginning of the predominantly dark slot and the packetized information slots of each frame;
  means for generating first RC time constant state for detection of information in the packetized information slots; and
  means for generating a second RC time constant state for detection of information in the predominantly dark slot.

16. The network of claim 15, the dynamic comparator comprising a dynamic DC level crossing detector; the AC coupling means further comprising:
  clamping means for clamping a DC voltage on the first output when the input signal represents a binary OFF training pulse, and for clamping a DC voltage from a DC voltage reference source on the second output when the input signal represents a binary ON training pulse,
  the OFF and ON training pulses forming part of a preamble contained in the packetized information slots.

17. The network of claim 16, the clamping means comprising:
  first coupling means having a first terminal connected to the first output and having a second terminal, for AC coupling signals on the first terminal to the second terminal of the first coupling means;
  first switching means, connected to the second terminal of the first coupling means, for connecting the second terminal to the DC voltage reference source during the OFF training pulse;
  second coupling means having a first terminal connected to the second output and having a second terminal, for AC coupling signals on the first terminal to the second terminal of the second coupling means; and
  second switching means, connected to the second terminal of the second coupling means, for connecting the second terminal to the DC voltage reference source during the ON training pulse;
  the AC coupling means further comprising third and fourth switching means for connecting a low impedance to the second terminals of the first and second coupling means, respectively, when establishing the second time constant state;
  the AC coupling means allowing the dynamic comparator to detect information in adjacent packetized information slots which can be received at levels lower than $-45$ dBm and higher than $-25$ dBm, with a bit error rate better than $10^{-9}$ for detecting data being transmitted at a frequency in excess of 20 megabits per second.

18. A method for receiving an input signal representing packets of information transmitted from a plurality of information sources, comprising the steps of:
  generating an electrical signal in response to the input signal; and
  AC coupling the electrical signal to a detector with a circuit capable of generating one of a plurality of available resistance-capacitance (RC) time constant states in dynamic response to the input signal.

19. A multi-RC time constant receiver for receiving optically encoded information that is formatted in frames, each frame comprising a slot which is predominantly dark adjacent a plurality of packetized information slots, the receiver comprising:
  means for converting the optically encoded information into an electrical signal;
  a single-to-differential generator which generates first and second differential output signals at first and second outputs, respectively, in response to the electrical signal, the first output signal being an inverse of the second output signal; and
  means for AC coupling the first and second output signals to a dynamic DC level crossing detector, the AC coupling means comprising
    means for predicting the beginning of the predominantly dark slot and the packetized information slots of each frame; and
    means for generating one of a plurality of available resistance-capacitance (RC) time constant states in dynamic response to the electrical signal, including at least a first RC time constant state for detection of information in the packetized information slots and a second RC time constant state for detection of information in the predominantly dark slot.

20. The receiver of claim 19, the packetized information slots containing information transmitted from a plurality of remote sources.

21. The receiver of claim 19, the AC coupling means further comprising:
  clamping means for clamping a DC voltage on the first output when the electrical signal represents a binary OFF training pulse, and for clamping a DC voltage from a DC voltage reference source on the second output when the electrical signal represents a binary ON training pulse, the OFF and ON training pulses forming part of a preamble contained in the packetized information slots.

22. The receiver of claim 21, the clamping means comprising:
  first coupling means having a first terminal connected to the first output and having a second terminal, for AC coupling signals on the first terminal to the second terminal of the first coupling means;
  first switching means, connected to the second terminal of the first coupling means, for connecting the second terminal to the DC voltage reference source during the OFF training pulse;
  second coupling means having a first terminal connected to the second output and having a second terminal, for AC coupling signals on the first terminal to the second terminal of the second coupling means; and
  second switching means, connected to the second terminal of the second coupling means, for connecting the second terminal to the DC voltage reference source during the ON training pulse.

23. The receiver of claim 22, the AC coupling means further comprising third and fourth switching means for connecting a low impedance to the second terminals of the first and second coupling means, respectively, when establishing the second time constant state.

24. The receiver of claim 19, the AC coupling means allowing the detector to detect information in adjacent packetized information slots which can be received at levels lower than $-45$ dBm and higher than $-25$ dBm, the detector having a bit error rate better than $10^{-9}$ for detecting data being transmitted at a frequency in excess of 20 megabits per second.

25. The receiver of claim 24, the data being capable of comprising at least four consecutive OFF pulses and at least four consecutive ON pulses.

26. A fiber-optic network, comprising:
a head end;
optical fiber link means; and
a plurality of remote stations connected to the head end by the optical fiber link means, each of the remote stations including transmitting means coupled to the optical fiber link means for transmitting packetized information thereon,
the first head end including receiving means for receiving an input signal comprising packetized information from one or more of the remote stations, the information being optically encoded and transmitted in frames, each frame comprising a slot which is predominantly dark adjacent a plurality of packetized information slots,
the receiving means comprising:
  means for converting the input signal into an electrical signal;
  a single-to-differential generator which generates first and second differential output signals at first and second outputs, respectively, in response to the electrical signal, the first output signal being an inverse of the second output signal; and
  means for AC coupling the first and second differential output signals to a dynamic DC level crossing detector, the AC coupling means comprising:
    means for predicting the beginning of the predominantly dark slot and the packetized information slots of each frame; and
    means for generating one of a plurality of available resistance-capacitance (RC) time constant states in dynamic response to the electrical signal, including at least a first RC time constant state for detection of information in the packetized information slots and a second RC time constant state for detection of information in the predominantly dark slot.

27. The network of claim 26, the AC coupling means further comprising:
clamping means for clamping a DC voltage on the first output when the input signal represents a binary OFF training pulse, and for clamping a DC voltage from a DC voltage reference source on the second output when the input signal represents a binary ON training pulse, the OFF and ON training pulses forming part of a preamble contained in the data slots of each frame.

28. The network of claim 27, the clamping means comprising:
first coupling means having a first terminal connected to the first output and having a second terminal, for AC coupling signals on the first terminal to the second terminal of the first coupling means;
first switching means, connected to the second terminal of the first coupling means, for connecting the second terminal to the DC voltage reference source during the OFF training pulse;
second coupling means having a first terminal connected to the second output and having a second terminal, for AC coupling signals on the first terminal to the second terminal of the second coupling means; and
second switching means, connected to the second terminal of the second coupling means, for connecting the second terminal to the DC voltage reference source during the ON training pulse.

29. The network of claim 28, the AC coupling means further comprising third and fourth switching means for connecting a low impedance to the second terminals of the first and second coupling means, respectively, when establishing the second time constant state.

30. The network of claim 26, the AC coupling means allowing the detector to detect information in adjacent packetized information slots which can be received at levels lower than −45 dBm and higher than −25 dBm, the detector having a bit error rate better than $10^{-9}$ for packetized information being transmitted at a frequency in excess of 20 megabits per second.

31. A method for receiving optically encoded information that is formatted in frames, each frame comprising a slot which is predominantly dark adjacent a plurality of packetized information slots, comprising the steps of:
generating an electrical signal in response to the input signal; and
AC coupling the electrical signal to a detector with a circuit capable of generating one of a plurality of available resistance-capacitance (RC) time constant states in dynamic response to the electrical signal, including at least a first RC time constant state for detection of information in the packetized information slots and a second RC time constant state for detection of information in the predominantly dark slot.

* * * * *

UNITED STATES PATENT AND TRADEMARK OFFICE
CERTIFICATE OF CORRECTION

PATENT NO. : 5,412,498
DATED : May 2, 1995
INVENTOR(S) : Arstein et al.

It is certified that error appears in the above-indentified patent and that said Letters Patent is hereby corrected as shown below:

On the title page: Item [75]

"Thomas E. Gles, Union;" should be replaced with --Thomas E. Giles, Union City;--.

Column 2, line 16 delete "at." and insert --al.--.

Column 10, line 1 delete "ram" and insert --rate--.

Column 13, line 62 delete "Flit" and insert --FET--.

Column 16, line 59 delete "RE" and insert --RC--.

Signed and Sealed this

Nineteenth Day of December, 1995

Attest:

BRUCE LEHMAN

*Attesting Officer*     *Commissioner of Patents and Trademarks*